United States Patent
Taniguchi

(10) Patent No.: US 10,826,458 B2
(45) Date of Patent: Nov. 3, 2020

(54) ELASTIC WAVE DEVICE, HIGH-FREQUENCY FRONT-END CIRCUIT, AND COMMUNICATION DEVICE

(71) Applicant: Murata Manufacturing Co., Ltd., Nagaokakyo (JP)

(72) Inventor: Yasumasa Taniguchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 20 days.

(21) Appl. No.: 16/398,330

(22) Filed: Apr. 30, 2019

(65) Prior Publication Data

US 2019/0260350 A1    Aug. 22, 2019

Related U.S. Application Data

(63) Continuation of application No. PCT/JP2017/037209, filed on Oct. 13, 2017.

(30) Foreign Application Priority Data

Nov. 9, 2016   (JP) .................. 2016-218618

(51) Int. Cl.
*H03H 9/02*   (2006.01)
*H03F 3/24*   (2006.01)
(Continued)

(52) U.S. Cl.
CPC ........... *H03H 9/02803* (2013.01); *H03F 3/24* (2013.01); *H03H 9/02559* (2013.01);
(Continued)

(58) Field of Classification Search
CPC ........... H03H 9/02803; H03H 9/02559; H03H 9/02992; H03H 9/14532; H03H 9/14541; H03H 9/25; H03F 3/24; H03F 2200/165; H03F 2200/171; H03F 2200/294; H03F 2200/451
(Continued)

(56) References Cited

U.S. PATENT DOCUMENTS

2004/0130239 A1   7/2004   Kando et al.
2013/0051588 A1   2/2013   Ruile et al.
2016/0065176 A1   3/2016   Taniguchi et al.

FOREIGN PATENT DOCUMENTS

JP   61-61512 A   3/1986
JP   06-6161 A    1/1994
(Continued)

OTHER PUBLICATIONS

Official Communication issued in International Patent Application No. PCT/JP2017/037209, dated Dec. 26 2017.
(Continued)

*Primary Examiner* — Benny T Lee
*Assistant Examiner* — Hafizur Rahman
(74) *Attorney, Agent, or Firm* — Keating & Bennett, LLP

(57) ABSTRACT

An elastic wave device includes, on an elastic wave element substrate, an IDT electrode including electrode fingers, and reflectors. At least one electrode finger of each of the reflectors include a portion having a relatively large thickness in a longitudinal direction and a portion having a relatively small thickness in the longitudinal direction. The portion having the relatively large thickness each reflector is thicker than a thickness of the electrode fingers of the IDT electrode.

20 Claims, 11 Drawing Sheets

(51) Int. Cl.
  *H03H 9/145* (2006.01)
  *H03H 9/25* (2006.01)
(52) U.S. Cl.
  CPC .... *H03H 9/02992* (2013.01); *H03H 9/14532* (2013.01); *H03H 9/14541* (2013.01); *H03H 9/25* (2013.01); *H03F 2200/165* (2013.01); *H03F 2200/171* (2013.01); *H03F 2200/294* (2013.01); *H03F 2200/451* (2013.01)
(58) Field of Classification Search
  USPC ......................................................... 333/195
  See application file for complete search history.

(56) References Cited

FOREIGN PATENT DOCUMENTS

| | | |
|---|---|---|
| JP | 2002-290194 A | 10/2002 |
| JP | 2004-208221 A | 7/2004 |
| JP | 2004-236285 A | 8/2004 |
| JP | 2013-518455 A | 5/2013 |
| JP | 2016-178387 A | 10/2016 |
| KR | 10-2015-0144797 A | 12/2015 |
| WO | 2014/192755 A1 | 12/2014 |

OTHER PUBLICATIONS

Official Communication issued in Korean Patent Application No. 10-2019-7011310, dated Jun. 19, 2020.

ELASTIC WAVE DEVICE, HIGH-FREQUENCY FRONT-END CIRCUIT, AND COMMUNICATION DEVICE

CROSS REFERENCE TO RELATED APPLICATIONS

This application claims the benefit of priority to Japanese Patent Application No. 2016-218618 filed on Nov. 9, 2016 and is a Continuation Application of PCT Application No. PCT/JP2017/037209 filed on Oct. 13, 2017. The entire contents of each of these applications are hereby incorporated herein by reference.

BACKGROUND OF THE INVENTION

1. Field of the Invention

The present invention relates to an elastic wave device, a high-frequency front-end circuit, and a communication device that each include reflectors provided on both sides of an IDT electrode.

2. Description of the Related Art

Elastic wave devices have been widely used in RF-stage band-pass filters of cellular phones or the like. Japanese Unexamined Patent Application Publication No. 2004-236285 discloses such an elastic wave device. In the elastic wave device, an IDT electrode is provided on a piezoelectric substrate. Furthermore, a pair of reflectors are provided on the piezoelectric substrate such that the IDT electrode is interposed therebetween. The IDT electrode and reflectors are made of the same metal film.

An existing elastic wave device has a drawback of a large ripple due to a longitudinal mode. Furthermore, the existing elastic wave device also has a drawback of a large loss in a frequency band, which is a region between a resonant frequency and an anti-resonant frequency.

SUMMARY OF THE INVENTION

Preferred embodiments of the present invention provide elastic wave devices, high-frequency front-end circuits, and communication devices that each have a small longitudinal mode ripple and a small in-band loss.

An elastic wave device according to a preferred embodiment of the present invention includes an elastic wave element substrate; an IDT electrode provided on the elastic wave element substrate and including a plurality of electrode fingers; and a pair of reflectors disposed on both sides of the IDT electrode and including a plurality of electrode fingers extending in a longitudinal direction. At least one electrode finger of the reflector includes a portion that has a relatively large thickness in the longitudinal direction and a portion that has a relatively small thickness in the longitudinal direction. The portion having the relatively large thickness in the reflector is thicker than a thickness of the electrode finger portion of the IDT electrode.

In an elastic wave device according to a preferred embodiment of the present invention, the electrode fingers of the IDT electrode include a first electrode finger connected to one potential and a second electrode finger connected to another potential. When a region in which the first electrode finger and the second electrode finger overlap each other in an elastic wave propagation direction is regarded as an intersection region, the first electrode finger and the second electrode finger include a central portion and a low acoustic velocity portion in the intersection region. The low acoustic velocity portion is provided on both sides of the central portion in a direction in which the first electrode finger and the second electrode finger extend and is a region in which an elastic wave propagation velocity is lower than an elastic wave propagation velocity in the central portion.

In an elastic wave device according to a preferred embodiment of the present invention, a thickness of the low acoustic velocity portion is thicker than an electrode finger thickness in the central portion.

In an elastic wave device according to a preferred embodiment of the present invention, an additional film is laminated in the low acoustic velocity portion, and the portion having a relatively large thickness in the reflector includes an additional film with a thickness identical to a thickness of the additional film in the low acoustic velocity portion.

In an elastic wave device according to a preferred embodiment of the present invention, an additional film is laminated in the low acoustic velocity portion, and the portion having a relative large thickness in the reflector includes an additional film made of a material identical to a material of the additional film in the low acoustic velocity portion.

In an elastic wave device according to a preferred embodiment of the present invention, in a region other than a region in which the low acoustic velocity portion extends in the elastic wave propagation direction, the portion having a relatively large thickness is provided in the reflector.

In an elastic wave device according to a preferred embodiment of the present invention, in the reflector, at least two electrode fingers of the plurality of electrode fingers include the portion having a relatively large thickness.

In an elastic wave device according to a preferred embodiment of the present invention, in the reflector, lengths of the portions having relatively large thicknesses of the at least two electrode fingers vary from one side to another side in the elastic wave propagation direction.

In an elastic wave device according to a preferred embodiment of the present invention, in the at least two electrode fingers of the reflector, the lengths of the portions having relatively large thicknesses sequentially increase from the IDT electrode side to a side away from the IDT electrode.

In an elastic wave device according to a preferred embodiment of the present invention, in the at least two electrode fingers of the reflector, the lengths of the portions having relatively large thicknesses sequentially decrease from the IDT electrode side to a side away from the IDT electrode.

In an elastic wave device according to a preferred embodiment of the present invention, in the plurality of electrode fingers, lengths of the portions having relatively large thicknesses of n number of electrode fingers (where n is a natural number not less than two) adjacent to each other in the elastic wave propagation direction are the same or substantially the same, and lengths of the portions having relatively large thicknesses vary every n number of electrode fingers in the elastic wave propagation direction.

In an elastic wave device according to a preferred embodiment of the present invention, in the reflector, the portion having a relatively large thickness is provided on both of a first end side and a second end side of the electrode fingers of the reflector.

In an elastic wave device according to a preferred embodiment of the present invention, in the reflector, the portions having larger thicknesses are disposed symmetrically or substantially symmetrically with respect to a virtual line passing through centers in the longitudinal direction of the electrode fingers of the reflector and extending in the elastic wave propagation direction.

In an elastic wave device according to a preferred embodiment of the present invention, of the pair of reflectors, the portion having a relatively larger thickness in one reflector is symmetrical or substantially symmetrical to the portion having a relatively large thickness in another reflector.

A high-frequency front-end circuit according to a preferred embodiment of the present invention includes an elastic wave device according to a preferred embodiment of the present invention; and a power amplifier.

A communication device according to a preferred embodiment of the present invention includes a high-frequency front-end circuit according to a preferred embodiment of the present invention; and an RF signal processing circuit.

The elastic wave devices according to preferred embodiments of the present invention each enable a reduction in longitudinal mode ripple and a reduction in in-band loss.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described below with reference to the drawings to clarify the present invention.

It is noted that preferred embodiments described in the present description are illustrative, and configurations may be partially replaced or combined with each other between different preferred embodiments.

Figure 1:
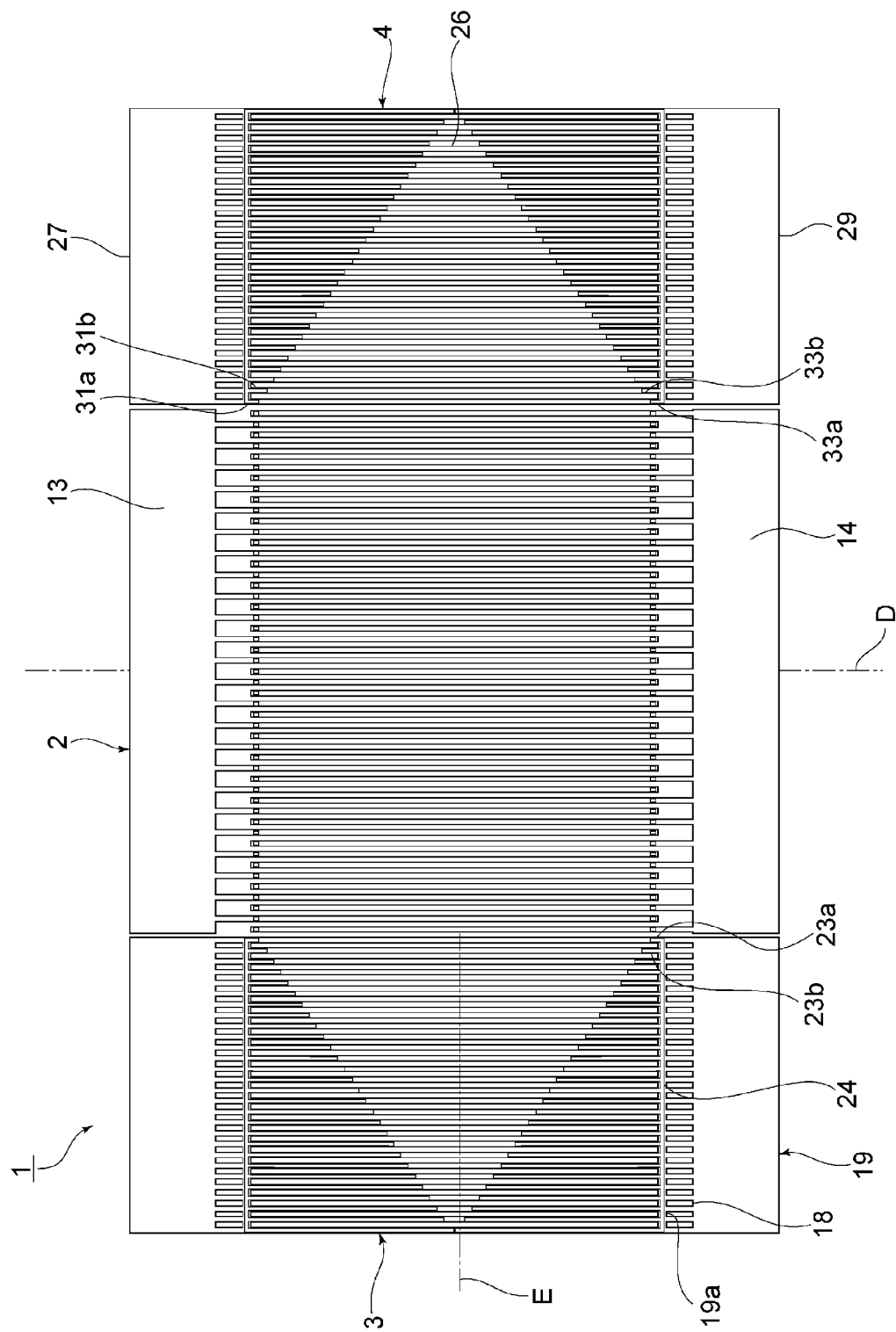
FIG. 1 is a plan view illustrating an electrode structure of an elastic wave device according to a first preferred embodiment of the present invention.
Figure 2:
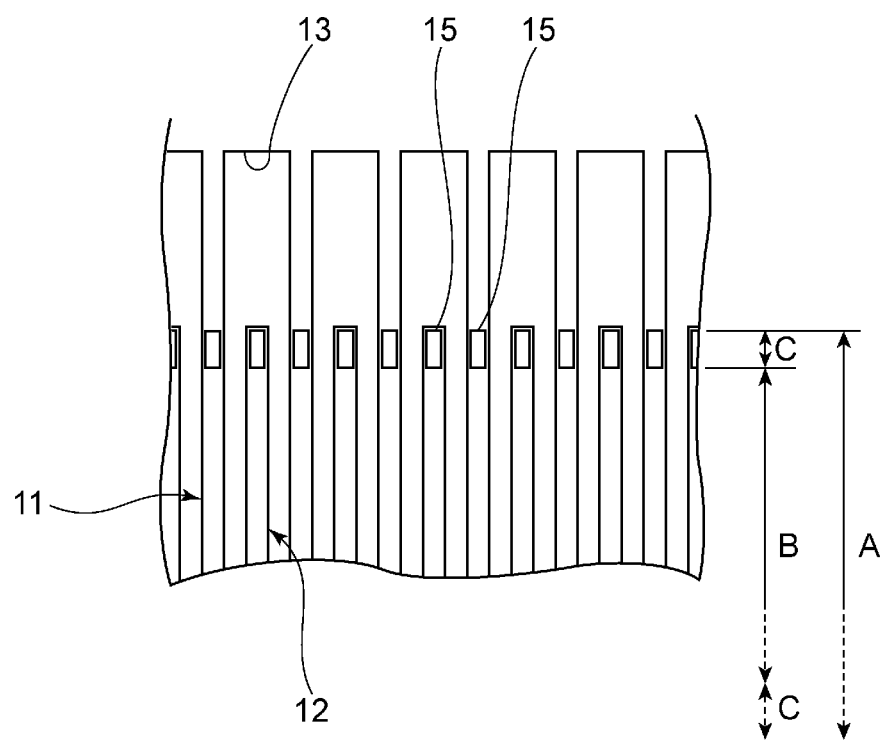
FIG. 2 is a partially enlarged cutaway plan view illustrating a portion of an IDT electrode in the elastic wave device according to the first preferred embodiment of the present invention.

FIG. 1 is a plan view illustrating an electrode structure of an elastic wave device 1 according to a first preferred embodiment of the present invention. In the present preferred embodiment, the electrode structure illustrated in FIG. 1 is provided on an elastic wave element substrate. The electrode structure includes an IDT electrode 2, and first and second reflectors 3 and 4. The first and second reflectors 3 and 4 are disposed on both sides of the IDT electrode 2 in an elastic wave propagation direction. Thus, as an elastic wave device, an elastic wave resonator is provided. FIG. 2 is a partially cutaway plan view illustrating a main portion of the IDT electrode 2. In the IDT electrode 2, a plurality of first electrode fingers 11 extending in a longitudinal direction and a plurality of second electrode fingers 12 extending in a longitudinal direction are interdigitated with each other. Ends of the first electrode fingers 11 are connected to a first busbar 13. As illustrated in FIG. 1, the first busbar 13 is disposed at a distance from a second busbar 14 in a direction perpendicular or substantially perpendicular to the elastic wave propagation direction. Ends of the plurality of second electrode fingers 12 are connected to the second busbar 14.

In an elastic wave device 1, a direction in which an elastic wave propagates is a direction perpendicular or substantially perpendicular to the longitudinal direction of the first and second electrode fingers 11 and 12. A region in which the first electrode fingers 11 and the second electrode fingers 12 overlap each other in the elastic wave propagation direction is an intersection region A. When an alternating-current voltage is applied to the plurality of first and second electrode fingers 11 and 12, an elastic wave is excited in the intersection region A. In the IDT electrode 2, the intersection region A includes a central portion B in a direction in which the first and second electrode fingers 11 and 12 extend, and a low acoustic velocity portion C that is provided on both sides of the central portion B in the direction in which the electrode fingers extend. FIG. 2 illustrates a portion at which low acoustic velocity portions C on one side are provided. As illustrated in FIG. 1, on a second busbar 14 side as well, the low acoustic velocity portions C are provided in portions at which end side portions of the first electrode fingers 11 overlap the second electrode fingers 12 in the elastic wave propagation direction.

The low acoustic velocity portion C is a region in which an elastic wave propagation velocity is lower than that in the central portion B. When the low acoustic velocity portion C is provided, a transverse mode ripple is able to be reduced. The low acoustic velocity portions C are provided by laminating an additional film 15 on the first and second electrode fingers 11 and 12. A material of the additional film 15 is not limited to a particular material as long as an acoustic velocity is able to be reduced as described above. Because of large effects of mass addition, metal or an inorganic insulating material is preferably used as a material of the additional film 15. Furthermore, metal is preferably used. More preferably, a material the same or substantially the same as that of the first and second electrode fingers 11 and 12 is used. This enables a simplification of a manufacturing process.

Figure 3:
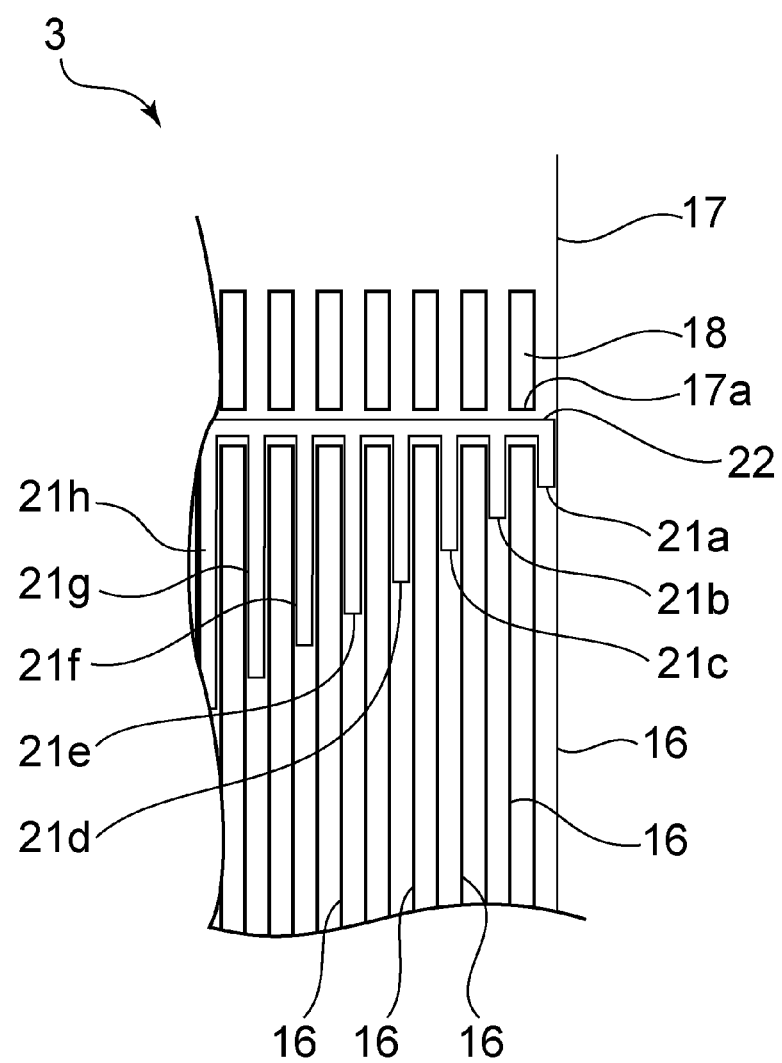
FIG. 3 is a partially enlarged cutaway plan view illustrating a portion of a reflector of the elastic wave device according to the first preferred embodiment of the present invention.

FIG. 3 is an enlarged partially cutaway plan view illustrating a portion of the first reflector 3. In the first reflector 3, a plurality of electrode fingers 16 extend in a direction perpendicular or substantially perpendicular to the elastic wave propagation direction. Ends of the electrode fingers 16 are connected to a first busbar 17. In the present preferred embodiment, cavities 18 are provided within the first busbar 17. The cavities 18 are located between regions at which the electrode fingers 16 are extended to a first busbar 17 side. Thus, in the first busbar 17, a narrow busbar portion 17a is provided on an electrode finger 16 side of the cavities 18. The electrode fingers 16 are connected to the narrow busbar portion 17a.

In opposite end portions of the electrode fingers 16 as well, the same or substantially the same structure is provided. As illustrated in FIG. 1, the electrode fingers 16 are connected to a narrow busbar portion 19a of a second busbar 19.

Incidentally, the above-described narrow busbar portions 17a and 19a are located at outer side portions with respect to the low acoustic velocity portions C of the above-described IDT electrode 2 in the direction in which the first and second electrode fingers 11 and 12 extend. Thus, when the electrode fingers 16 are viewed in the elastic wave propagation direction, the electrode fingers 16 extend to outer side portions with respect to the intersection region A in the direction in which the first and second electrode fingers 11 and 12 extend.

In the elastic wave device 1, in the plurality of electrode fingers 16, additional films 21a to 21h are provided individually as illustrated in FIG. 3.

In the present preferred embodiment, in the plurality of electrode fingers 16, the lengths of the additional films 21a to 21h sequentially increase from an IDT electrode 2 side with distance from the IDT electrode 2. Furthermore, as illustrated in FIG. 1, on a side close to the second busbar 19 as well, additional films 23a and 23b are similarly provided on the electrode fingers 16. Thus, in the first reflector 3, weights are assigned to the plurality of electrode fingers 16.

When the additional films 21a to 21h are provided, portions having thicknesses larger than thicknesses of remaining portions are provided in the electrode fingers 16. The thicknesses of the portions having larger thicknesses are increased by providing the additional films 21a to 21h and are thicker than the thickness of an electrode finger portion of the IDT electrode 2 overlapping, in the elastic wave propagation direction, a region at which the additional films 21a to 21h are provided. Other words, the thicknesses of the portions having larger thicknesses are increased by providing the additional films 21a to 21h and are thicker than the thickness of at least one of the plurality of the electrode fingers 11 and 12 of the IDT electrode 2 overlapping, in the elastic wave propagation direction, a region at which the additional films 21a to 21h are provided, without a thickness of the additional films 23a and 23b as illustrated in FIG. 1.

Although an additional film 22 is also provided on the narrow busbar portion 17a, the additional film 22 does not need to be provided. In the present preferred embodiment, one ends of the plurality of additional films 21a to 21h are connected in series to the additional film 22, and the additional films 21a to 21h are therefore able to be easily formed by patterning.

In the opposite narrow busbar portion 19a as well, an additional film 24 is similarly provided so as to extend in the elastic wave propagation direction.

As illustrated in FIG. 1, the second reflector 4 has the same or substantially the same structure. That is, one ends of a plurality of electrode fingers 26 are connected to a first busbar 27, and the other ends are connected to a second busbar 29. On the plurality of electrode fingers 26 as well, additional films 31a, 31b, and 33a, 33b, are provided as described above.

A portion whose thickness is different in the first reflector 3 is symmetrical or substantially symmetrical to a portion having a relatively larger thickness in the second reflector 4 with respect to a virtual line D passing through a center of the IDT electrode 2 in the elastic wave propagation direction and extending in the direction in which the first and second electrode fingers 11 and 12 extend. Furthermore, in the first reflector 3, portions having relatively large thicknesses are symmetrical or substantially symmetrical with respect to a virtual line E passing through centers in a longitudinal direction of the electrode fingers 16 and extending in the elastic wave propagation direction.

In the elastic wave device 1, in the electrode fingers 16 and 26 of the first and second reflectors 3 and 4, a portion having a relatively large thickness and a portion having a relatively small thickness are provided. Thus, a longitudinal mode ripple is able to be reduced, and an in-band loss is able to be reduced. This is made clear by comparing the following Example 1 with the following Comparative Example 1 with respect to the elastic wave device 1 according to the present preferred embodiment.

Figure 4:
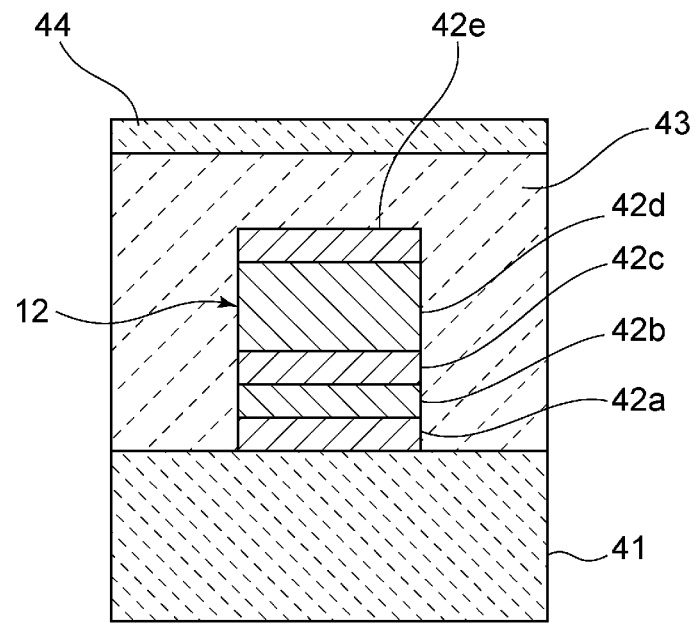
FIG. 4 is a partially enlarged cross-sectional view of the elastic wave device in a central portion in an intersection region in the IDT electrode of the elastic wave device of an Example 1 of a preferred embodiment of the present invention.
Figure 5:
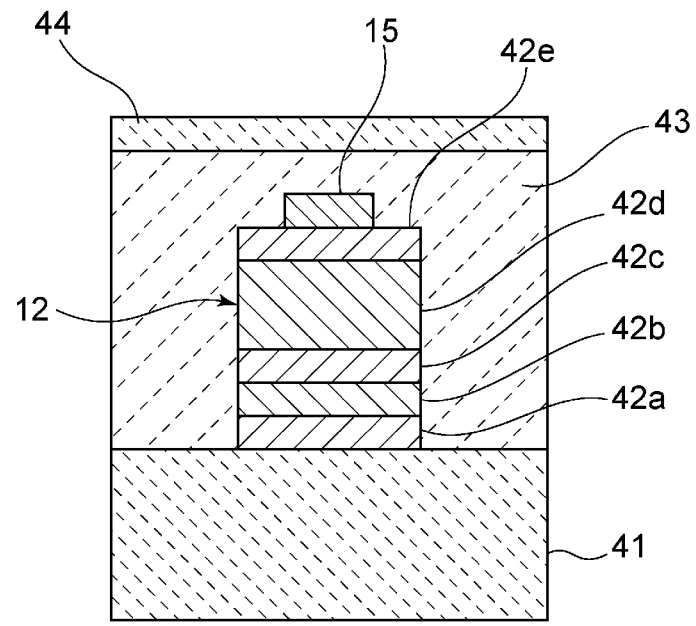
FIG. 5 is a partially enlarged cross-sectional view of the elastic wave device in a low acoustic velocity portion of an electrode finger in the elastic wave device of the Example 1.

Details of the Example 1 are as follows. FIG. 4 is a partially enlarged cross-sectional view of the elastic wave device in a central portion in the intersection region in the IDT electrode of the elastic wave device of Example 1. FIG. 5 is a partially enlarged cross-sectional view of the elastic wave device in a low acoustic velocity portion of an electrode finger in the elastic wave device of the Example 1. As illustrated in FIG. 4, each of the second electrode fingers 12 preferably includes a NiCr film 42a, a Pt film 42b, a Ti film 42c, an AlCu film 42d, and a Ti film 42e, in this order on an elastic wave element substrate 41 preferably made of about 128.5° Y-cut X-propagation LiNbO$_3$, for example. As illustrated in FIG. 5, in the low acoustic velocity portion, the additional film 15 preferably made of Pt, for example, is further laminated on the Ti film 42e. Then, a SiO$_2$ film 43, for example, illustrated in FIGS. 4 and 5 covers the IDT electrode 2. On the SiO$_2$ film 43, a SiN film 44 is preferably laminated.

In the Example 1, in the IDT electrode 2, the number of pairs of electrode fingers is 40 pairs, a wavelength λ determined by an electrode finger pitch is about 4 μm, an intersecting width, that is, the length of the intersection region A is about 100 μm, and a duty ratio is about 0.5. In the first and second reflectors 3 and 4, the number of the electrode fingers 16 or the electrode fingers 26 is 21.

In the Example 1, as described above, the additional films 21a, 21b, . . . , and 23a, 23b, . . . are provided on the electrode fingers 16 starting at an electrode finger 16 closest to the IDT electrode 2. The same holds true on a second reflector 4 side.

As a material of the additional films 21a, 21b, . . . , and 23a, 23b, . . . , a Pt film, for example, is preferably used as in the additional film 15. The thicknesses of the additional films 21a, 21b, ..., and 23a, 23b, ... are the same or substantially the same as the thickness of the additional film 15.

The elastic wave device of the Example 1 has a resonant frequency of about 888 MHz and an anti-resonant frequency of about 918 MHz, for example.

Figure 6:
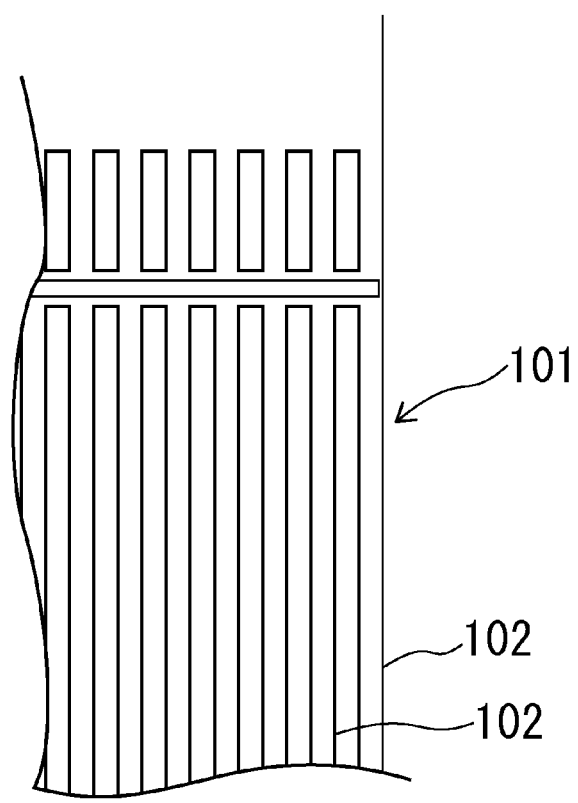
FIG. 6 is a partially enlarged cutaway plan view illustrating a portion of a reflector in the elastic wave device of a Comparative Example 1.

On the other hand, FIG. 6 is an enlarged partially cutaway plan view illustrating a portion of a reflector in the elastic wave device of the Comparative Example 1. As illustrated in FIG. 6, in the Comparative Example 1, the additional films 21a, 21b, ..., and 23a, 23b, ... are not provided on a plurality of electrode fingers 102 of a reflector 101. The Comparative Example 1 is otherwise similar to the Example 1.

Figure 7:
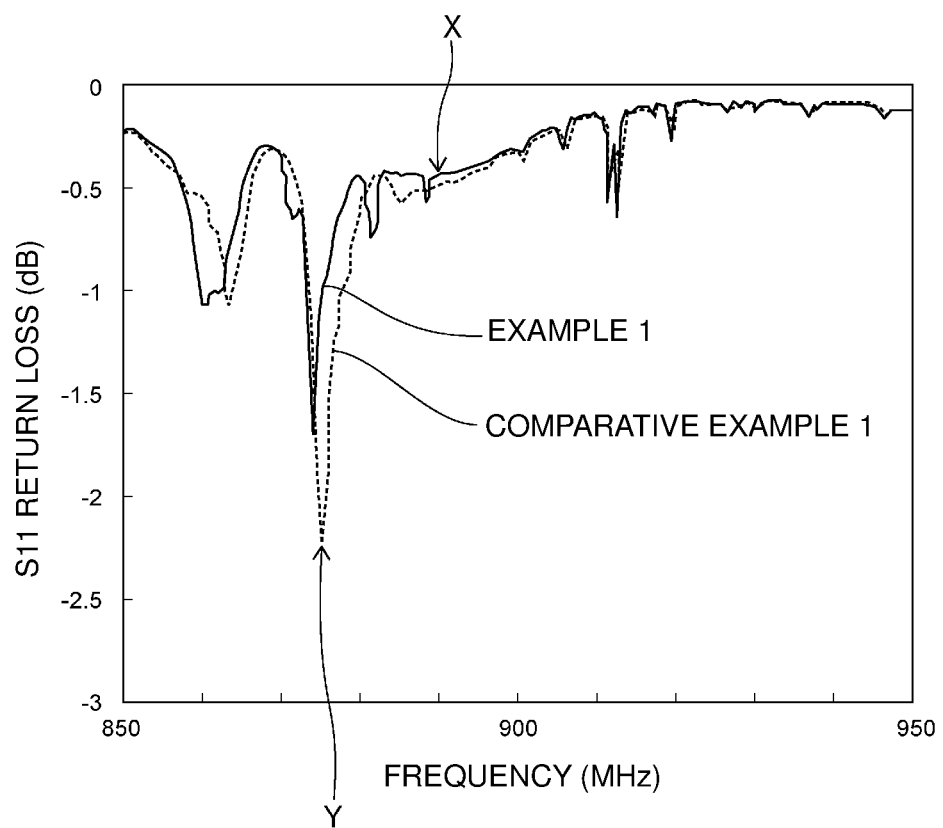
FIG. 7 illustrates return loss characteristics in the Example 1 and the Comparative Example 1.

FIG. 7 illustrates S11 return loss characteristics in the Example 1 and the Comparative Example 1. As is apparent in FIG. 7, as represented by an arrow X, a loss in the vicinity of the resonant frequency is about 0.5 dB in the Comparative Example 1, whereas in the Example 1, the loss has a low value of about 0.45 dB. Furthermore, it is seen that, as represented by an arrow Y, a longitudinal mode ripple reaches a maximum of about 2.24 dB in the Comparative Example 1, whereas in the Example 1, the longitudinal mode ripple is reduced to about 1.71 dB. It is considered that this is because, in the first and second reflectors 3 and 4, the lengths of the portions having relatively large thicknesses vary in the elastic wave propagation direction. That is, in individual regions in an intersecting width direction, phases of reflected waves are different, and the reflected waves cancel each other, thus improving the longitudinal mode ripple.

Thus, it is seen that, in the elastic wave device 1, both a reduction in longitudinal mode ripple and an improvement in in-band loss are able to be achieved.

In the present preferred embodiment, although, in the first and second reflectors 3 and 4, the portions having relatively large thicknesses are provided by providing the additional films 21a, 21b, ..., and 23a, 23b, ... on the electrode fingers 16 and 26, portions having relatively small thicknesses may be provided by partially thinning electrode fingers by etching or other suitable method, for example, instead of providing additional films.

Figure 8:
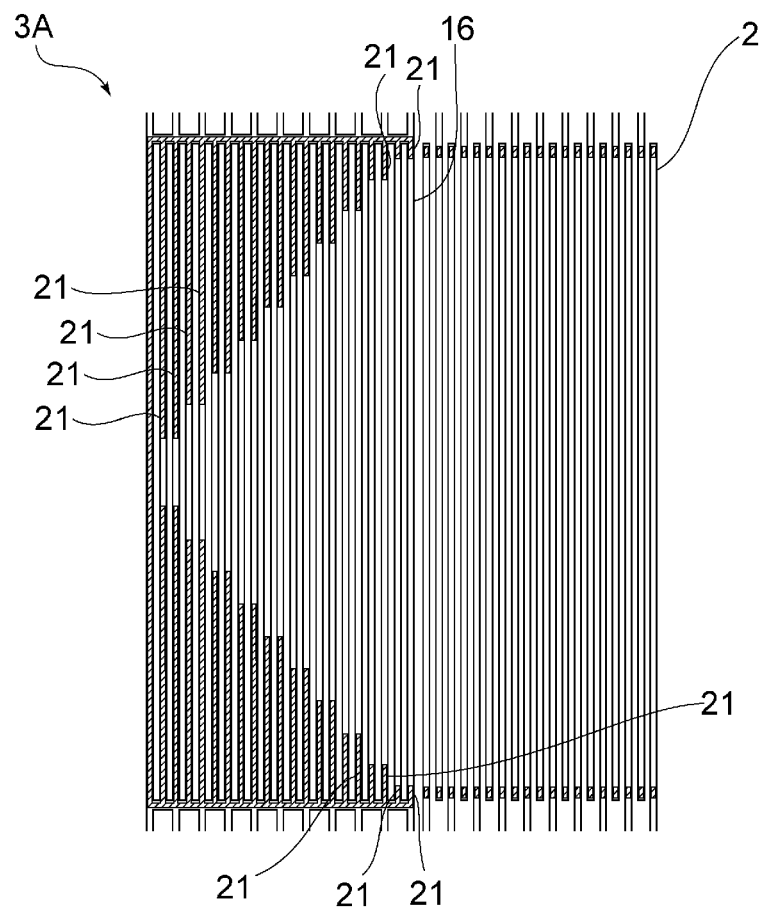
FIG. 8 is a partially enlarged plan view illustrating an electrode structure of a portion of the IDT electrode and one reflector in an elastic wave device according to a second preferred embodiment of the present invention.

FIG. 8 is a partially enlarged plan view illustrating an electrode structure of a portion of the IDT electrode and one reflector in an elastic wave device according to a second preferred embodiment of the present invention.

In the elastic wave device according to the second preferred embodiment, in a reflector 3A, the lengths of additional films 21 vary every two electrode fingers starting at an electrode finger 16 on a side adjacent to the IDT electrode 2. That is, the lengths of the additional films 21 provided on the electrode fingers 16 increase every two electrode fingers with distance from the IDT electrode 2 in the elastic wave propagation direction. Thus, the lengths of the additional films 21 may vary every n number of electrode fingers (where n is an integer not less than two).

Figure 9:
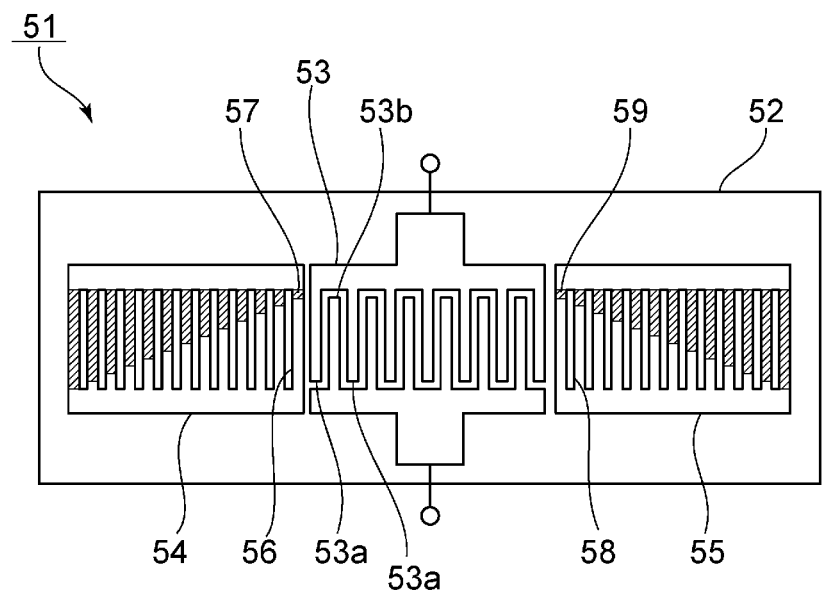
FIG. 9 is a plan view of an elastic wave device according to a third preferred embodiment of the present invention.

FIG. 9 is a plan view of an elastic wave device according to a third preferred embodiment of the present invention.

An elastic wave device 51 includes an elastic wave element substrate 52. The elastic wave element substrate 52 is preferably made of LiTaO$_3$, for example. However, the elastic wave element substrate 52 may be made of another piezoelectric single crystal or piezoelectric ceramics, for example.

The elastic wave element substrate 52 is a substrate having piezoelectricity on at least a surface thereof. For example, the elastic wave element substrate 52 includes a piezoelectric thin film on the surface and may be defined by a multilayer body including a film whose acoustic velocity is different from that of the piezoelectric thin film, a supporting substrate, and other suitable layers. Furthermore, the elastic wave element substrate 52 may have piezoelectricity throughout the entire substrate. In this case, the elastic wave element substrate 52 is a piezoelectric substrate defined by one piezoelectric body layer.

On the elastic wave element substrate 52, an IDT electrode 53, and reflectors 54 and 55 are provided. In the reflector 54, both ends of a plurality of electrode fingers 56 are short-circuited. On the respective electrode fingers 56, additional films 57 are provided. Portions at which the additional films 57 are provided are thicker than remaining electrode finger portions. The thicknesses of the portions at which the additional films 57 are provided are preferably thicker than those of first and second electrode fingers 53a and 53b of the IDT electrode 53. The thicknesses of the first and second electrode fingers 53a and 53b are uniform or substantially uniform in a longitudinal direction.

The reflector 55 is also configured as in the reflector 54, and additional films 59 are provided on electrode fingers 58. In the reflector 55, the lengths of the additional films 59 are sequentially increased from a side close to the IDT electrode 53 with distance from the IDT electrode 53.

The elastic wave device 51 preferably includes a normal IDT electrode 53.

In the present preferred embodiment, the additional films 57 and 59 are provided as described above, and a longitudinal mode ripple is able to be reduced. This will be described with reference to FIG. 10.

Figure 10:
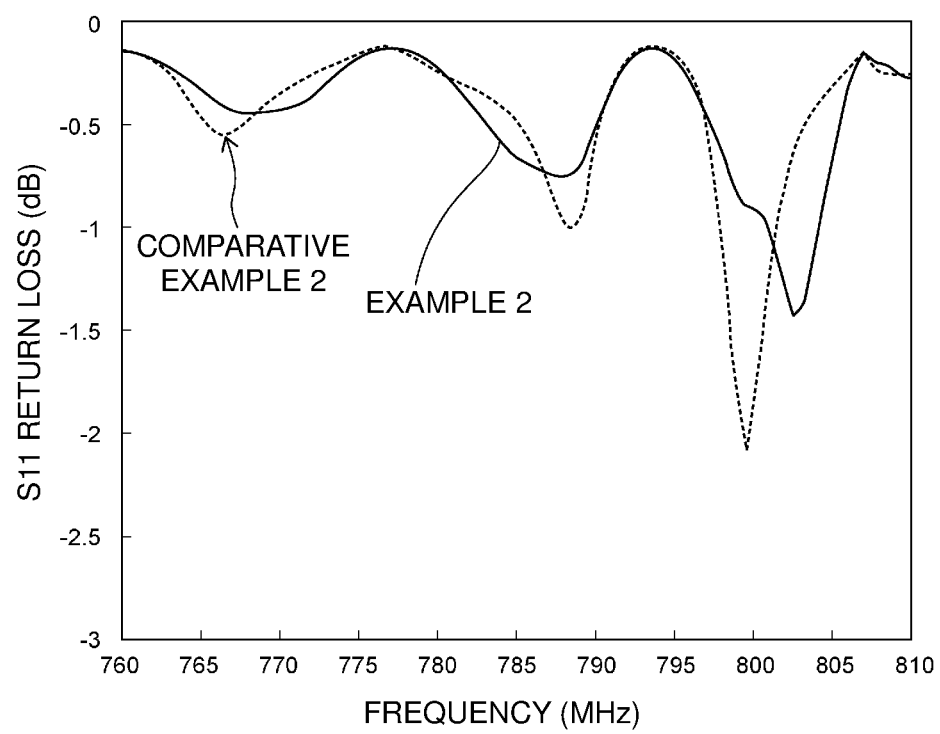
FIG. 10 illustrates return loss characteristics in an Example 2, which is an example of the third preferred embodiment, and a Comparative Example 2.

FIG. 10 illustrates return loss characteristics in an Example 2 as an example of the third preferred embodiment, and a Comparative Example 2. A solid line represents a result in the Example 2, and a dashed line represents a result in the Comparative Example 2.

Design parameters in the Example 2 are as follows.

Elastic wave element substrate 52: about 42° Y-cut X-propagation LiTaO$_3$ substrate
 IDT electrode 53:
 Number of pairs of electrode fingers=40 pairs
 Intersecting width=about 100 µm
 Wavelength λ determined by electrode finger pitch=about 4.8 µm A laminated structure of each electrode finger of the IDT electrode 53 includes, from top to bottom, an AlCu film and a Ti film, in this order.

Number of electrode fingers of each of reflectors 54 and 55=21 fingers
 Wavelength λ of each of electrode fingers 56 and 58=about 4.8 µm An electrode laminated structure of each of the electrode fingers 56 and 58 is the same or substantially the same as that of the IDT electrode 53.

As the additional films 57 and 59, additional films preferably made of Pt, for example are provided.

The elastic wave device of the Example 2 has a resonant frequency of about 810 MHz and an anti-resonant frequency of about 841 MHz, for example.

The Comparative Example 2 is similar to the Example 2 except that the additional films 57 and 59 are not provided.

As is apparent in FIG. 10, in each of a range of about 763 MHz to about 775 MHz, a range of about 784 MHz to about 792 MHz, and a range of about 796 MHz to about 805 MHz, a longitudinal mode ripple in the Example 2 is smaller than that in the Comparative Example 2. Thus, it is seen that, in the Example 2, the longitudinal mode ripple is able to be reduced without deteriorating an in-band loss.

As in the elastic wave device 51 according to the third preferred embodiment, the IDT electrode does not have to be an IDT electrode using a piston mode.

Figure 11:
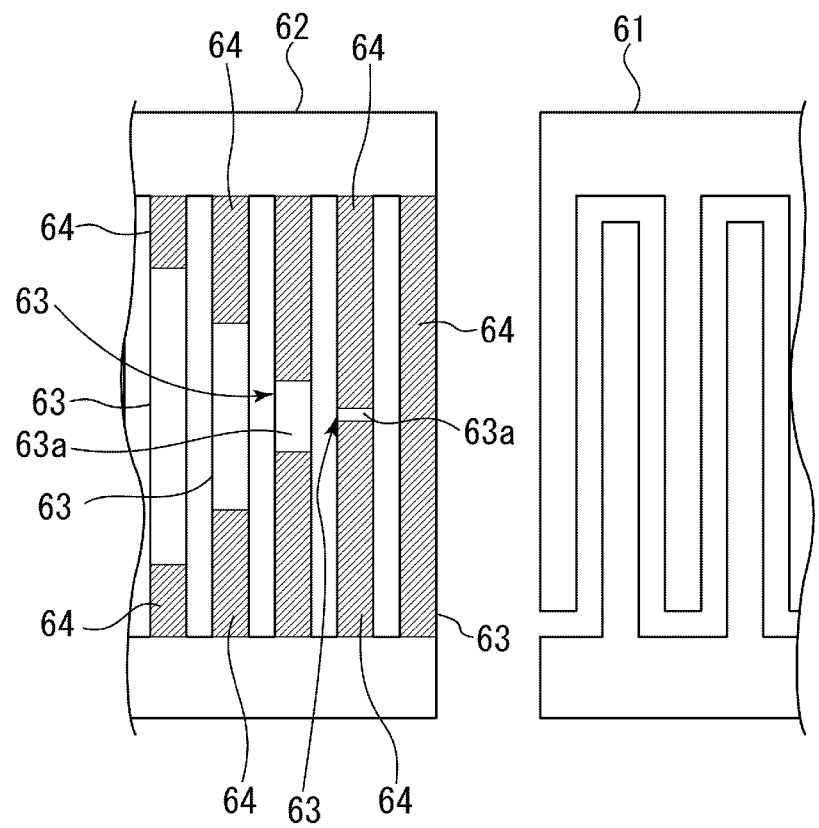
FIG. 11 is a partially enlarged plan view illustrating an electrode structure of an elastic wave device according to a fourth preferred embodiment of the present invention.

FIG. 11 is a partially enlarged plan view illustrating an electrode structure of an elastic wave device according to a fourth preferred embodiment. In the fourth preferred embodiment, one reflector 62 is adjacent to an IDT electrode 61. The reflector 62 includes a plurality of electrode fingers 63. On each of the electrode fingers 63, an additional film 64 is provided. On an electrode finger 63 closest to the IDT electrode 61, the additional film 64 is provided across the entire or substantially the entire length in a longitudinal direction of the electrode finger 63. On an electrode finger other than the electrode finger 63 closest to the IDT electrode 61, a pair of additional films 64 are provided so as to face each other with a gap 63a provided at a central portion in a longitudinal direction of the electrode finger interposed therebetween. The lengths of the additional films 64 are reduced with distance from the IDT electrode 61.

Thus, in the reflector 62, the lengths of portions having relatively large thicknesses may be reduced with distance from the IDT electrode 61.

Figure 12:
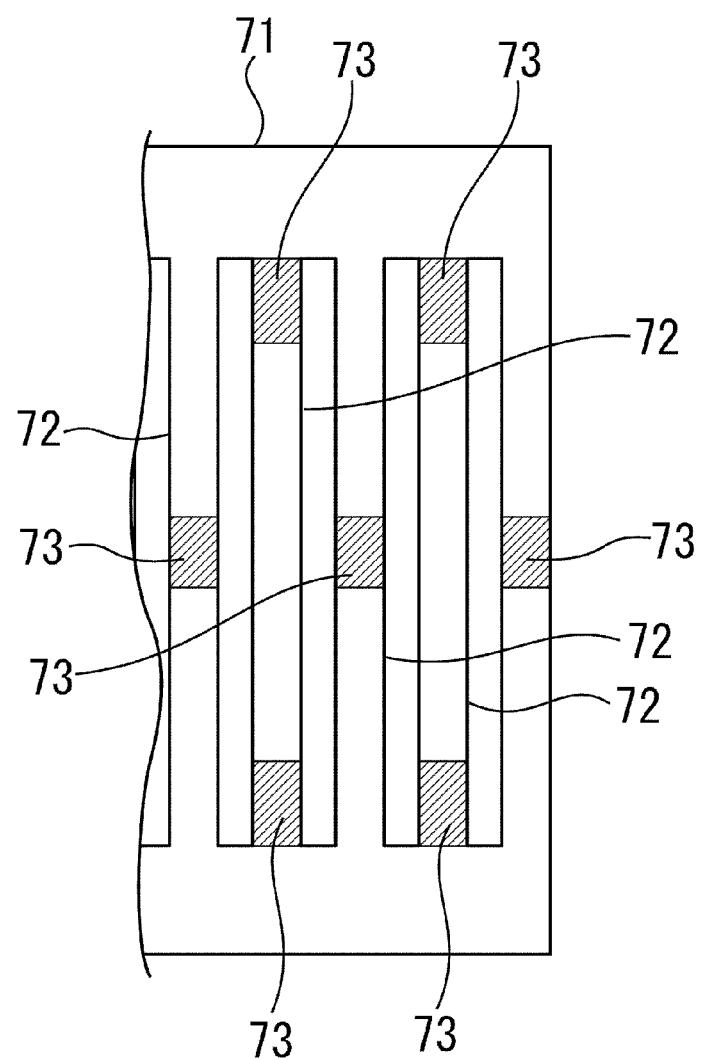
FIG. 12 is a partially cutaway enlarged plan view illustrating an electrode shape of a reflector of an elastic wave device according to a fifth preferred embodiment of the present invention.

FIG. 12 is a partially cutaway enlarged plan view illustrating an electrode shape of a reflector of an elastic wave device according to a fifth preferred embodiment of the present invention.

In a reflector 71, additional films 73 are provided on electrode fingers 72. In this case, a configuration in which an additional film 73 is provided at a central portion in a longitudinal direction of an electrode finger 72 and a configuration in which additional films 73 are provided at respective both ends in the longitudinal direction of an electrode finger 72 are alternately disposed in the elastic wave propagation direction. Thus, in the present preferred embodiment, configurations of portions having relatively large thicknesses are not limited to configurations that sequentially vary in the elastic wave propagation direction, and various configurations may be provided. In this case as well, reflected waves are out of phase with each other between a region at which an additional film is provided and a region other than the region, thus making it possible to facilitate an improvement in longitudinal mode ripple and an improvement in in-band loss as in the first to fourth preferred embodiments.

The elastic wave devices according to each of the above-described preferred embodiments may be used as a component of a duplexer or other suitable devices of a high-frequency front-end circuit. An example of a high-frequency front-end circuit according to a preferred embodiment of the present invention will be described below.

Figure 13:
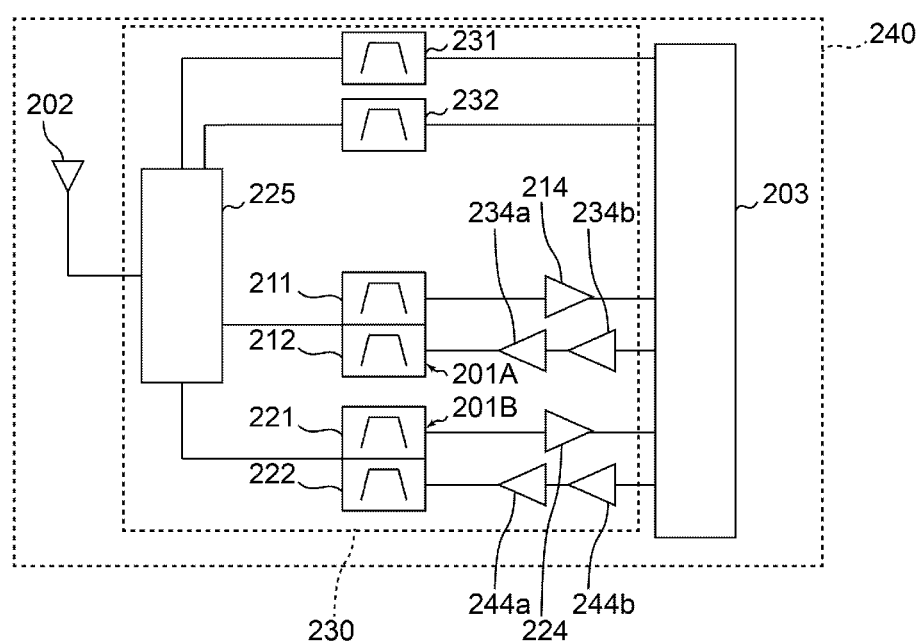
FIG. 13 illustrates a configuration of a communication device including a high-frequency front-end circuit.

FIG. 13 illustrates a configuration of a communication device including a high-frequency front-end circuit. FIG. 13 also illustrates components, such as an antenna element 202 and an RF signal processing circuit (RFIC) 203, connected to a high-frequency front-end circuit 230. The high-frequency front-end circuit 230 and the RF signal processing circuit 203 define a communication device 240. The communication device 240 may include a power supply, a CPU, and a display, for example.

The high-frequency front-end circuit 230 includes a switch 225, duplexers 201A and 201B, filters 231 and 232, low-noise amplifier circuits 214 and 224, and power amplifier circuits 234a, 234b, 244a, and 244b. The high-frequency front-end circuit 230 and the communication device 240 illustrated in FIG. 13 are examples of a high-frequency front-end circuit and a communication device and are not limited to this configuration.

The duplexer 201A includes filters 211 and 212. The duplexer 201B includes filters 221 and 222. The duplexers 201A and 201B are connected to the antenna element 202 through the switch 225. Components including the above-described elastic wave devices may be the duplexers 201A and 201B, or may be the filters 211, 212, 221, and 222. Components including the elastic wave devices according to preferred embodiments of the present invention may be elastic wave devices defining the duplexers 201A and 201B, or elastic wave devices defining the filters 211, 212, 221, and 222.

Furthermore, the elastic wave devices above-described may also be used in a multiplexer including three or more filters, such as a triplexer in which a common connection is provided among antenna terminals of three filters or a hexaplexer in which a common connection is provided among antenna terminals of six filters.

That is, examples of the elastic wave devices above-described include an elastic wave resonator, a filter, a duplexer, and a multiplexer including three or more filters. The multiplexer is not limited to a configuration in which both a transmission filter and a reception filter are included, and a configuration in which only the transmission filter or only the reception filter is included may be used.

The switch 225 connects, in accordance with a control signal from a controller (not illustrated), the antenna element 202 to a signal path corresponding to a certain band and is preferably defined by, for example, an SPDT (Single Pole Double Throw) switch. The number of signal paths to be connected to the antenna element 202 is not limited to one and may be two or more. That is, the high-frequency front-end circuit 230 may support carrier aggregation.

The low-noise amplifier circuit 214 is a reception amplifier circuit that amplifies a radio frequency signal (a radio frequency reception signal here) having passed through the antenna element 202, the switch 225, and the duplexer 201A and outputs the radio frequency signal to the RF signal processing circuit 203. The low-noise amplifier circuit 224 is a reception amplifier circuit that amplifies a radio frequency signal (a radio frequency reception signal here) having passed through the antenna element 202, the switch 225, and the duplexer 201B and outputs the radio frequency signal to the RF signal processing circuit 203.

The power amplifier circuits 234a and 234b are a transmission amplifier circuit that amplifies a radio frequency signal (a radio frequency transmission signal here) output from the RF signal processing circuit 203 and outputs the radio frequency signal to the antenna element 202 through the duplexer 201A and the switch 225. The power amplifier circuits 244a and 244b are a transmission amplifier circuit that amplifies a radio frequency signal (a radio frequency transmission signal here) output from the RF signal processing circuit 203 and outputs the radio frequency signal to the antenna element 202 through the duplexer 201B and the switch 225.

The RF signal processing circuit 203 performs, through down-converting, for example, signal processing on a radio frequency reception signal input from the antenna element 202 through a reception signal path and outputs a reception signal generated by performing the signal processing. Furthermore, the RF signal processing circuit 203 performs, through up-converting, for example, signal processing on an input transmission signal and outputs a radio frequency transmission signal generated by performing the signal processing to the power amplifier circuits 234a, 234b. The RF signal processing circuit 203 is preferably an RFIC, for example. The communication device 240 may include a BB (baseband) IC. In this case, the BBIC performs signal processing on a reception signal processed by the RFIC. The BBIC also performs signal processing on a transmission signal and outputs the transmission signal to the RFIC. A reception signal processed by the BBIC or a transmission signal before being subjected to signal processing performed by the BBIC is, for example, an image signal, a voice signal, or other suitable signal. The high-frequency front-end circuit 230 may include another circuit element between the above-described components.

The high-frequency front-end circuit 230 may include duplexers according to modifications of the above-described duplexers 201A and 201B in place of the duplexers 201A and 201B.

The filters 231 and 232 in the communication device 240 are connected between the RF signal processing circuit 203 and the switch 225 with no interposed low-noise amplifier circuits 214 and 224 and no interposed power amplifier circuits 234a, 234b, 244a, and 244b. The filters 231 and 232 are also connected to the antenna element 202 through the switch 225 as in the duplexers 201A and 201B.

The high-frequency front-end circuit 230 and the communication device 240 configured as described above are able to achieve the advantageous effects of preferred embodiments of the present invention by including an elastic wave resonator, a filter, a duplexer, a multiplexer including three or more filters, for example, that are defined by the elastic wave devices according to preferred embodiments of the present invention.

Although the elastic wave devices, the high-frequency front-end circuits, and the communication devices according to the preferred embodiments of the present invention have been described above, and modifications of the preferred embodiments, the present invention also includes other preferred embodiments achieved by combining any components in the above-described preferred embodiments and modifications, modifications obtained by making various modifications conceived by a person skilled in the art to the above-described preferred embodiments without departing from the gist of the present invention, and various devices including the high-frequency front-end circuits and the communication devices according to preferred embodiments of the present invention.

Preferred embodiments of the present invention may be widely used, as an elastic wave resonator, a filter, a duplexer, a multiplexer used in a multi-band system, a front-end circuit, and a communication device, in communication equipment, such as cellular phones, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
   an elastic wave element substrate;
   an IDT electrode provided on the elastic wave element substrate and including a plurality of electrode fingers; and
   a pair of reflectors disposed on both sides of the IDT electrode and including a plurality of electrode fingers extending in a longitudinal direction; wherein
   at least one electrode finger of each of the pair of reflectors includes a portion having a relatively large thickness in the longitudinal direction and a portion having a relatively small thickness in the longitudinal direction; and
   the portion having the relatively large thickness in each of the pair of reflectors is thicker than at least one of the plurality of electrode fingers of the IDT electrode.

2. The elastic wave device according to claim 1, wherein the plurality of electrode fingers of the IDT electrode include a first electrode finger connected to one potential and a second electrode finger connected to another potential;
   wherein a region in which the first electrode finger and the second electrode finger overlap each other in an elastic wave propagation direction defines an intersection region, the first electrode finger and the second electrode finger include a central portion and a low acoustic velocity portion in the intersection region; and
   the low acoustic velocity portion is provided on both sides of the central portion in a direction in which the first electrode finger and the second electrode finger extend and is a region in which an elastic wave propagation velocity is lower than an elastic wave propagation velocity in the central portion.

3. The elastic wave device according to claim 2, wherein a thickness of the low acoustic velocity portion is greater than an electrode finger thickness in the central portion.

4. The elastic wave device according to claim 3, wherein a first additional film is laminated in the low acoustic velocity portion; and
   the portion having the relatively large thickness in each of the pair of reflectors includes a second additional film having a thickness that is the same or substantially the same as a thickness of the first additional film.

5. The elastic wave device according to claim 3, wherein a first additional film is laminated in the low acoustic velocity portion; and
   the portion having the relatively large thickness in each of the pair of reflectors includes a second additional film made of a material that is the same or substantially the same a material of the first additional film.

6. The elastic wave device according to claim 2, wherein, in a region other than a region in which the low acoustic velocity portion is extended in the elastic wave propagation direction, the portion having the relatively large thickness is provided in each of the pair of reflectors.

7. The elastic wave device according to claim 1, wherein, in each of the pair of reflectors, at least two electrode fingers of the plurality of electrode fingers include the portion having the relatively large thickness.

8. The elastic wave device according to claim 7, wherein, in each of the pair of reflectors, lengths of the portions having the relatively large thicknesses of the at least two electrode fingers vary from one side to another side in the elastic wave propagation direction.

9. The elastic wave device according to claim 8, wherein, in the at least two electrode fingers of each of the pair of reflectors, the lengths of the portions having the relatively large thicknesses sequentially increase from an IDT electrode side to a side spaced away from the IDT electrode.

10. The elastic wave device according to claim 8, wherein, in the at least two electrode fingers of each of the pair of reflectors, the lengths of the portions having the relatively large thicknesses sequentially decrease from an IDT electrode side to a side spaced away from the IDT electrode.

11. The elastic wave device according to claim 7, wherein, in the plurality of electrode fingers, lengths of the portions having the relatively large thicknesses of n number of electrode fingers, where n is a natural number not less than two, adjacent to each other in the elastic wave propagation direction are the same or substantially the same, and lengths of the portions having the relatively large thicknesses vary every n number of electrode fingers in the elastic wave propagation direction.

12. The elastic wave device according to claim 1, wherein, in each of the pair of reflectors, the portion having the relatively large thickness is provided on both of one end side and another end side of the electrode fingers of each of the pair of reflectors.

13. The elastic wave device according to claim 12, wherein, in each of the pair of reflectors, the portions having the relatively large thicknesses are disposed symmetrically with respect to a virtual line passing through centers in the longitudinal direction of the plurality of electrode fingers of each of the pair of reflectors and extending in the elastic wave propagation direction.

14. The elastic wave device according to claim 1, wherein, of the pair of reflectors, the portion having the relatively large thickness in one of the pair of reflectors is symmetrical or substantially symmetrically to the portion having the relatively large thickness in another one of the pair of reflectors.

15. A high-frequency front-end circuit comprising:
the elastic wave device according to claim 1; and
a power amplifier.

16. The high-frequency front-end circuit according to claim 15, wherein
the plurality of electrode fingers of the IDT electrode include a first electrode finger connected to one potential and a second electrode finger connected to another potential;
wherein a region in which the first electrode finger and the second electrode finger overlap each other in an elastic wave propagation direction defines an intersection region, the first electrode finger and the second electrode finger include a central portion and a low acoustic velocity portion in the intersection region; and the low acoustic velocity portion is provided on both sides of the central portion in a direction in which the first electrode finger and the second electrode finger extend and is a region in which an elastic wave propagation velocity is lower than an elastic wave propagation velocity in the central portion.

17. The high-frequency front-end circuit according to claim 16, wherein a thickness of the low acoustic velocity portion is greater than an electrode finger thickness in the central portion.

18. The high-frequency front-end circuit according to claim 17, wherein a first additional film is laminated in the low acoustic velocity portion; and
the portion having the relatively large thickness in each of the pair of reflectors includes a second additional film having a thickness that is the same or substantially the same as a thickness of the first additional film.

19. The high-frequency front-end circuit according to claim 17, wherein a first additional film is laminated in the low acoustic velocity portion; and
the portion having the relatively large thickness in each of the pair of reflectors includes a second additional film made of a material the same or substantially the same a material of the first additional film.

20. A communication device comprising:
the high-frequency front-end circuit according to claim 15; and
an RF signal processing circuit.

* * * * *